(12) United States Patent
Hori

(10) Patent No.: US 8,227,355 B2
(45) Date of Patent: Jul. 24, 2012

(54) METHOD AND APPARATUS OF FABRICATING SEMICONDUCTOR DEVICE

(75) Inventor: Mitsuaki Hori, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 240 days.

(21) Appl. No.: 11/413,012

(22) Filed: Apr. 28, 2006

(65) Prior Publication Data

US 2007/0166892 A1    Jul. 19, 2007

(30) Foreign Application Priority Data

Jan. 19, 2006   (JP) ................................. 2006-011603

(51) Int. Cl.
*H01L 21/00* (2006.01)
(52) U.S. Cl. .......... 438/762; 438/763; 438/907; 438/908
(58) Field of Classification Search .......... 438/762–763, 438/907–908, 981
See application file for complete search history.

(56) References Cited

U.S. PATENT DOCUMENTS

| | | | |
|---|---|---|---|
| 3,837,905 A * | 9/1974 | Hile et al. .................. | 438/585 |
| T954,009 I4 * | 1/1977 | Malin et al. ................ | 438/774 |
| 5,846,375 A * | 12/1998 | Gilchrist et al. ........ | 156/345.52 |
| 6,284,609 B1 * | 9/2001 | Ang et al. .................. | 438/300 |
| 6,602,751 B2 * | 8/2003 | Oohashi ...................... | 438/275 |
| 6,642,573 B1 * | 11/2003 | Halliyal et al. ............ | 257/316 |
| 6,933,248 B2 * | 8/2005 | Grider ......................... | 438/786 |
| 7,122,454 B2 * | 10/2006 | Olsen .......................... | 438/542 |
| 7,678,711 B2 | 3/2010 | Hori et al. | |
| 2005/0048705 A1 * | 3/2005 | Burnham et al. ........... | 438/197 |
| 2005/0151211 A1 | 7/2005 | Hori et al. | |
| 2007/0087583 A1 * | 4/2007 | Olsen et al. ................ | 438/786 |

FOREIGN PATENT DOCUMENTS

| | | |
|---|---|---|
| JP | 2002-100627 | 4/2002 |
| JP | 2002-110674 | 4/2002 |
| JP | 2002-198531 | 7/2002 |
| JP | 2003-142482 A | 5/2003 |
| JP | 2005-223309 A | 8/2005 |
| JP | 2005-530344 A | 10/2005 |
| WO | WO-03/107399 | 12/2003 |

OTHER PUBLICATIONS

Japanese Office Action mailed May 10, 2011 for corresponding Japanese Application No. 2006-011603, with English-language Summary.
Japanese Office Action mailed Nov. 8, 2011 for corresponding Japanese Application No. 2006-011603, with Partial English-language Translation.

* cited by examiner

*Primary Examiner* — Richard A. Booth
(74) *Attorney, Agent, or Firm* — Fujitsu Patent Center

(57) ABSTRACT

An underlying film forming section forming an underlying film on a semiconductor substrate is provided to an apparatus of fabricating a semiconductor device. The apparatus is further provided with a cooling section cooling the semiconductor substrate and a plasma nitriding section introducing active nitrogen into the underlying film while keeping the temperature of the semiconductor substrate cooled by the cooling section at 100° C. or below. The semiconductor substrate is cooled by using liquid nitrogen or liquid helium, and by cooling a stage on which the semiconductor substrate is placed.

16 Claims, 10 Drawing Sheets

FIG. 6

| SECTION | PROCESS | TIME | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| UNDERLAYING FILM FORMING SECTION 2 | FORMING UNDERLAYING FILM | | 1ST | | 2ND | | 3RD | | 4TH | | 5TH | | 6TH | | 7TH | | 8TH |
| COOLING SECTION 3 | COOLING | | | 1ST | | 2ND | | 3RD | | 4TH | | 5TH | | 6TH | | 7TH | |
| PLASMA NITRIDING SECTION 4 | PLASMA NITRIDING | | | | 1ST | | 2ND | | 3RD | | 4TH | | 5TH | | 6TH | | |
| POST-ANNEALING SECTION 6 | POST-ANNEALING | | | | | 1ST | | 2ND | | 3RD | | 4TH | | 5TH | | | |

| SECTION | PROCESS | TIME | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| UNDERLAYING FILM FORMING SECTION 2 | FORMING UNDERLAYING FILM + COOLING | | 1ST | | | | 2ND | | | | 3RD | | | | 4TH | | 5TH |
| PLASMA NITRIDING SECTION 4 | PLASMA NITRIDING | | | | | 1ST | | | | 2ND | | | | 3RD | | ... | 4TH |
| POST-ANNEALING SECTION 6 | POST-ANNEALING | | | | | | | 1ST | | | | 2ND | | | 3RD | ... | 4TH |

| SECTION | PROCESS | TIME | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| UNDERLAYING FILM FORMING SECTION 2 | FORMING UNDERLAYING FILM | | 1ST | | 2ND | | 3RD | | 4TH | | 5TH | | 6TH | | 7TH | | 8TH |
| PLASMA NITRIDING SECTION 4 | COOLING + PLASMA NITRIDING | | | | 1ST | | | | 2ND | | 3RD | | | 4TH | | 5TH |
| POST-ANNEALING SECTION 6 | POST-ANNEALING | | | | | | 1ST | | 2ND | | 3RD | ... | | 3RD | | 4TH |

METHOD AND APPARATUS OF FABRICATING SEMICONDUCTOR DEVICE

CROSS-REFERENCE TO RELATED APPLICATIONS

This application is based upon and claims the benefit of priority from the prior Japanese Patent Application No. 2006-011603, filed on Jan. 19, 2006, the entire contents of which are incorporated herein by reference.

BACKGROUND OF THE INVENTION

1. Field of the Invention

The present invention relates to a method and an apparatus suitable for fabricating a semiconductor device capable of high-speed operation.

2. Description of the Related Art

In pursuit of improvement in degree of integration and in operation speed of semiconductor integrated circuit devices, a MOSFET as a constituent thereof is becoming downsized, and a gate insulating film is becoming thinned. A gate electrode formed on the insulating film is composed solely of a polysilicon layer, or a stack of a polysilicon layer and a silicide layer. The polysilicon layer is doped with an impurity ion species at the same time as ion-implantation for source-and-drain regions. For example, a gate electrode and source-and-drain regions of a surface-channel-type n-channel MOSFET has an n-type impurity such as phosphorus doped therein by ion implantation. On the other hand, a gate electrode and source-and-drain regions of a surface-channel-type p-channel MOSFET has a p-type impurity such as boron doped therein by ion implantation.

The surface-channel-type p-type MOSFET, however, raises a problem of causing penetration of boron implanted into the gate electrode through the gate insulating film to reach an n-type channel region, when the gate insulating film has only a small thickness. This undesirably varies the threshold voltage and degrades the charge mobility.

With respect to the phenomenon, it has been known that the introduction of nitrogen into the gate insulating film can effectively suppress the boron penetration. One known method of introducing nitrogen into silicon oxide film composing a gate insulating film is such as heating a silicon substrate by resistance heating or lamp heating in a nitriding gas atmosphere containing $NH_3$ gas, NO gas, $N_2O$ gas or the like. Another known method is such as introducing a higher concentration of nitrogen into a surface of the silicon oxide film using a nitrogen plasma.

On the other hand, for a case where a gate insulating film of not thicker than 2 nm is used, it is known that a tunneling current may flow between a gate electrode and a channel region, to thereby increase a gate leakage current. For example, decrease in the thickness of the gate insulating film by 0.2 nm or around may result in increase in the gate leakage current by one order of magnitude or around. Control of the thickness of the gate insulating film is therefore understood as an important issue.

It is also known that a gate insulating film, entire portion or a part of which is composed of a high-dielectric-constant insulating film having a dielectric constant larger than that of a silicon oxide film, makes it possible to increase the physical thickness, while suppressing the thickness on the basis of inversion capacity, and to thereby suppress a gate leakage current. The high-dielectric-constant insulating film can be exemplified by a silicon oxynitride film. The silicon oxynitride film generally has a larger dielectric constant than the silicon oxide film has, and is therefore effective for increasing the physical thickness while suppressing the thickness on the basis of inversion capacity.

Patent document 1 describes a method of forming a gate insulating film having a uniform nitrogen concentration. In this method, a gate insulating film composed of silicon oxide formed on a silicon substrate is introduced with nitrogen by remote plasma nitriding, and is then annealed for oxynitriding at 800° C. to 1100° C. in a $N_2O$ atmosphere, to thereby re-distribute the nitrogen. It is also described that formation of a gate insulating film having a uniform nitrogen concentration of 6 at % or more, for example 8 at % or 10 at %, makes it possible to obtain a long-life, and highly reliable transistor. The remote plasma nitriding described herein refers to a treatment in which a nitrogen plasma is generated with the aid of microwave or the like in a plasma generation chamber which is separately provided besides a treatment chamber having a substrate housed therein, and active nitrogen is transferred to the treatment chamber so as to proceed nitriding.

Patent document 2 describes a technique of suppressing nitrogen concentration in the vicinity of the interface with a Si substrate, aiming at solving a problem that nitrogen introduced in the vicinity of the interface on the Si substrate side undesirably lowers a carrier mobility of a MOS transistor, and of introducing a larger amount of nitrogen on a film surface side, aiming at reducing a gate leakage current. It is also described that the nitrogen concentration in the surficial portion of the film can be increased by subjecting a silicon oxynitride film, preliminarily doped with nitrogen, to radical nitriding using nitrogen gas, so as to suppress a flow of nitrogen diffusing from the surficial portion, and to thereby suppress the amount of introduction of nitrogen in the vicinity of the interface with the silicon substrate.

However, these conventional techniques may sometimes result in only insufficient levels of control of the thickness and characteristics of the gate insulating film.

Related arts are disclosed in:

patent document 1 (Japanese Patent Application Laid-Open No. 2002-198531);

patent document 2 (Japanese Patent Application Laid-Open No. 2002-110674); and patent document 3 (Japanese Patent Application Laid-Open No. 2002-100627).

SUMMARY OF THE INVENTION

It is therefore an object of the present invention to provide a method and an apparatus of fabricating a semiconductor device, capable of forming a gate insulating film having desired characteristics.

The present inventor has completed an invention with regard to a method of forming a silicon oxynitride film and has filed it for patent application (Japanese Patent Application No. 2005-505936). According to the filed method, introduction of active nitrogen generated with the aid of plasma into a silicon oxide film or into a silicon oxynitride film gives a nitrogen concentration profile showing a peak in the surficial portion or in the internal portion. Suppression of the nitrogen concentration at the interface between the gate insulating film and a silicon substrate can successfully suppress lowering in the carrier mobility in the channel region. This means that high-speed operation is realized. It is also made possible to suppress degradation in the NBTI (negative bias temperature instability) characteristic, which is a degradation characteristic measured under elevated temperature under stress. Post-annealing after the plasma nitriding makes it possible to recover any damages, and also to control the nitrogen concentration at the interface and a bonding state. The reasons in the above are contributive to improvement in the reliability.

However, this method may sometimes result in only an insufficient level of control of the thickness and characteristics of the gate insulating film, although being successful in achieving the expected results.

The present inventor therefore made further experiments and investigations. Results of the experiments conducted by the present inventor will be explained below.

First, a silicon substrate was subjected to thermal oxidation in a lamp annealing apparatus, at 900° C. in an oxygen atmosphere, to thereby form a $SiO_2$ film of 0.9 nm thick. The silicon substrate was then cooled in the same chamber used for the thermal oxidation (thermal oxidation chamber), and was transferred to a plasma nitriding chamber conditioned at room temperature. The $SiO_2$ film was immediately subjected to plasma nitriding, to thereby obtain a gate insulating film. Relations between the cooling time after the thermal oxidation and the thickness of the gate insulating film were determined.

In another experiment, a $SiO_2$ film of 0.9 nm thick was formed similarly to as described in the above, and a silicon substrate was cooled for 30 seconds in the thermal oxidation chamber. The silicon substrate was then transferred to the plasma nitriding chamber conditioned at room temperature. The silicon substrate was further cooled in the plasma nitriding chamber. The $SiO_2$ film is then subjected to plasma nitriding to thereby obtain a gate insulating film. Relations between the total cooling time (cooling time in the thermal oxidation chamber (30 seconds) and cooling time in the plasma nitriding chamber) and the thickness of the gate insulating film were determined.

The silicon substrates herein were transferred under an inert gas atmosphere.

Results are shown in FIG. 7. Plots ♦ and a solid line indicate the results of the experiment in which the cooling was carried out only in the thermal oxidation chamber. Plots ▲ and a broken line indicate the results of the experiment in which the cooling was carried out both in the thermal oxidation chamber and in the plasma nitriding chamber.

As is clear from FIG. 7, both experiments showed larger film thickness under longer cooling time. This means that lower temperature of the silicon substrate results in thinner film. For the case of cooling only in the thermal oxidation chamber, it was found that only a small change in the film thickness was observed after the cooling for 30 seconds or longer. This was supposedly because residual heat remaining in the chamber prevented the cooling from being promoted. On the other hand, a distinct decrease in the film thickness correspondent to the cooling time was observed when the cooling was carried out also in the plasma nitriding chamber.

From the experimental results as described in the above, the present inventor found out that the temperature of the substrate affects the plasma nitriding, by which the thickness of the gate insulating film fluctuates.

In other words, even when the plasma nitriding chamber was conditioned at room temperature so as to control energy of the generated active nitrogen, reactivity between the active nitrogen and the silicon oxide film would become unnecessarily large, under high temperature of the substrate having the silicon oxide film reactive with the active nitrogen formed thereon. It is supposed that this consequently increased the amount of introduction of nitrogen into the silicon nitride film, and accelerated the diffusion thereof in the silicon oxide film.

From a counter viewpoint, it can be said that a thorough control of the substrate temperature makes it possible to control the degree of silicon nitriding within a desired range, and thereby to obtain the gate insulating film having desired thickness and characteristics.

The present inventor has thus reached the following aspects of the invention.

In a method of fabricating a semiconductor device of the present invention, a first insulating film is formed on a semiconductor substrate, and then the semiconductor substrate is cooled. The first insulating film is then introduced with active nitrogen, while keeping the temperature of the semiconductor substrate at 100° C. or below.

An apparatus of fabricating a semiconductor device of the present invention has a first insulating film forming unit forming a first insulating film on a substrate. There are also provided a cooling unit cooling the semiconductor substrate, and a nitriding unit introducing active nitrogen into the first insulating film, while keeping the temperature of the semiconductor substrate cooled by the cooling unit at 100° C. or below.

BRIEF DESCRIPTION OF THE DRAWINGS

FIG. 6 is a drawing showing relations of presence or absence of the cooling section 3 with the number of processed substrates.

DETAILED DESCRIPTION OF THE PREFERRED EMBODIMENTS

Figure 1:
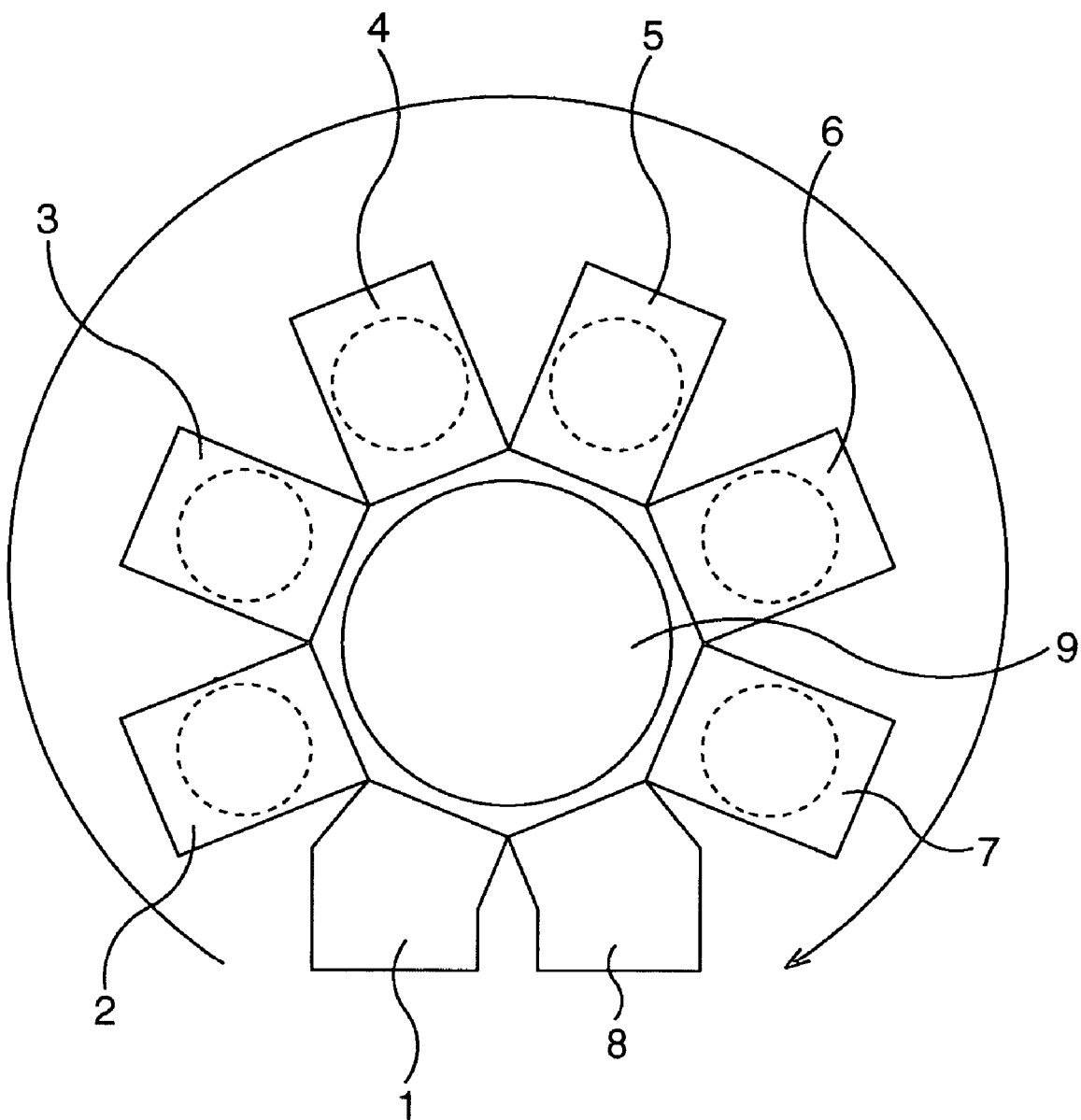
FIG. 1 is a schematic drawing showing an apparatus for manufacturing a semiconductor device according to an embodiment of the present invention.

Paragraphs below will specifically explain embodiments of the present invention referring to the attached drawings. FIG. 1 is a schematic drawing showing an apparatus for manufacturing a semiconductor device according to an embodiment of the present invention.

In the apparatus of fabricating a semiconductor device (apparatus of forming gate insulating film) according to the present embodiment is provided with a transfer system (transfer unit) 9. A loading port 1, an underlying film forming section (first insulating film forming unit) 2, a cooling section (cooling unit) 3, a plasma nitriding section (nitriding unit) 4, a high-dielectric-constant film forming section (second insulating film forming unit) 5, a post-annealing section (annealing unit) 6, a cooling section 7 and an unloading port 8 are respectively coupled with the transfer system (transfer unit) 9 around itself. The internal of the transfer system 9 is conditioned as a non-oxidative atmosphere isolated from the air (for example, inert gas atmosphere such a nitrogen atmosphere, or a reductive atmosphere such as a hydrogen atmosphere). The loading port 1 and the unloading port 8 are load-lock chambers, for example.

The underlying film forming section 2 is provided with a lamp heating device or a resistance heating device, for example. The underlying film forming section 2 allows to carry out thermal oxidation of a semiconductor substrate in an oxygen atmosphere at 900° C. or around, to thereby form an oxide film (a silicon oxide film, for example) on the surface of the semiconductor substrate. It is also allowable to form the underlying film by plasma oxidation. The underlying film forming section 2 may be provided also with an apparatus of removing a native oxide film or the like by annealing the semiconductor substrate in a reductive atmosphere. Removal of the native oxide film before forming the underlying film makes it possible to more precisely control thickness of the film.

The cooling section 3 cools the semiconductor substrate heated in the underlying film forming section 2. The temperature to be attained in the cooling is set, for example, to 100° C. or below, and preferably to not higher than the room temperature. This is because energy of active nitrogen is lowered in the later process of plasma nitriding. Cooling of the semiconductor substrate is effected by cooling a stage on which the semiconductor substrate is placed, using liquid nitrogen or liquid helium, for example.

The plasma nitriding section 4 carries out plasma nitriding of the oxide film formed on the semiconductor substrate after being cooled by the cooling section 3 at room temperature, for example. The oxide film is consequently converted to an oxynitride film (for example, a silicon oxynitride film). The plasma nitriding is started while keeping the temperature of the semiconductor substrate at 100° C. or below, and more preferably not higher than the room temperature. This is because the plasma nitriding started at a high temperature may result in variation in the thickness of a gate insulating film due to raised energy of active nitrogen as described above.

The nitrogen plasma is preferably generated at a position distant from the semiconductor substrate, because it is made possible to readily lower the energy of active nitrogen, by adjusting plasma power or pressure. Lowering in the energy of active nitrogen facilitates control of nitrogen dose, also makes it more ready to distribute a larger amount of nitrogen at a depth closer to the top surface of the gate insulating film, and still also makes it more ready to prevent the diffusion towards the interface with the semiconductor substrate.

The high-dielectric-constant film forming section 5 forms a high-dielectric-constant film, having a dielectric constant larger than that of the silicon oxide film, on the oxynitride film on the semiconductor substrate. The high-dielectric-constant film can be exemplified by a silicon nitride film, a hafnium oxide film, a tantalum oxide film, a zirconium oxide film, a lanthanum oxide film, a praseodymium oxide film and the like. A gate insulating film is therefore configured by the oxynitride film and the high-dielectric-constant film. It is to be noted that formation of the high-dielectric-constant film in the high-dielectric-constant film forming section 5 is omissible. The gate insulating film in this case is composed solely of the oxynitride film.

The post-annealing section 6 carries out post-annealing of the semiconductor substrate having the gate insulating film formed thereon. The post-annealing section 6 is equipped with a lamp heating device or resistance heating device, for example. In the post-annealing, oxidative annealing (RTO: rapid thermal oxidation) under a reduced-pressure oxygen atmosphere at around 1000° C., and annealing (RTA: rapid thermal annealing) under a nitrogen atmosphere at around 1050° C. are successively carried out, for example. The post-annealing may also be effected by a treatment in an oxynitriding atmosphere. An example of the annealing is such as oxynitriding annealing in a reduced-pressure NO gas at 900° C. to 1050° C., which is followed by annealing in a nitrogen atmosphere at 1050° C.

The cooling section 7 cools the semiconductor substrate heated by the post-annealing section 6.

Paragraphs below will explain a method of fabricating a semiconductor device using thus configured apparatus.

(First Method of Fabrication)

FIGS. 2A to 2F are sectional views sequentially showing process steps of a first method of fabricating a semiconductor device.

Figure 2A:
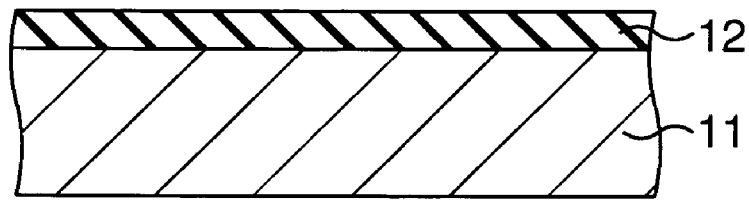
FIGS. 2A to 2F are sectional views sequentially showing a first method of fabricating a semiconductor device.

The first method of fabrication begins with wet cleaning of a Si substrate 11, which is followed by formation of a silicon oxide film 12 thereon by thermal oxidation as shown in FIG. 2A. The thickness of the silicon oxide film 12 is set to 1.5 nm or smaller, for example. The silicon oxide film 12 is formed using the apparatus shown in FIG. 1. More specifically, the Si substrate 11 is loaded through the loading port 1 into the transfer system 9, and then in the underlying film forming section 2, the silicon oxide film 12 is formed as an underlying film on the surface of the Si substrate 11.

Next, the Si substrate 11 is transferred to the cooling section 3 using the transfer system 9. The Si substrate 11 and the silicon oxide film 12 are then cooled in the cooling section 3, for example, down to 100° C. or below, more preferably to 60° C. or below, and still more preferably to the room temperature or below. Use of a coolant such as liquid helium, liquid nitrogen or the like makes it possible to attain a cooling temperature of as low as −40° C. or around, even with a relatively simple configuration. Cooling to this degree is supposed to be sufficient for obtaining an effect of suppressing any excessive reaction with active nitrogen.

Figure 2B:
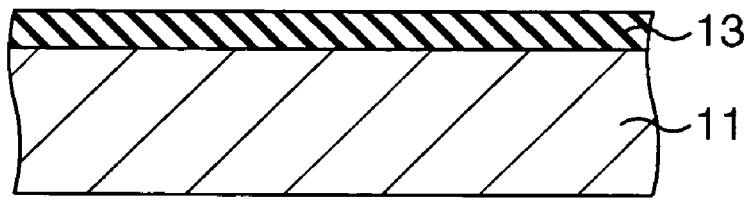

The Si substrate 11 is then transferred to the plasma nitriding section 4 using the transfer system 9. Next, the silicon oxide film 12 is subjected to plasma nitriding, to thereby convert the silicon oxide film 12 into a silicon oxynitride film 13 as shown in FIG. 2B. It is preferable herein to keep the Si substrate 11 in a non-oxidative atmosphere and unexposed to the atmospheric air, over a period from formation of the silicon oxide film 12 to conversion to the silicon oxynitride film 13, in view of retaining a certain thickness of the silicon oxide film 12. In the plasma nitriding, active nitrogen is introduced into the silicon oxide film 12 by exciting a nitrogen plasma at an RF power of 500 W, under conditions of 2.66 Pa (20 mTorr) at room temperature, for example.

Figure 2C:
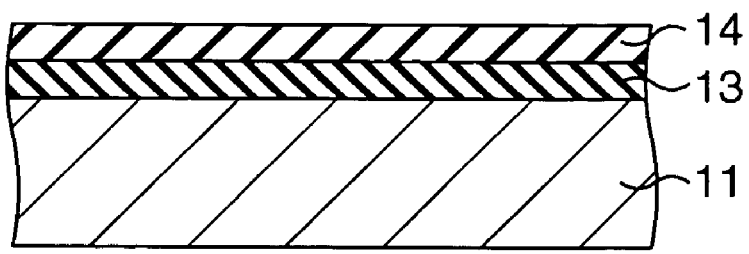

Next, the Si substrate 11 is then transferred to the high-dielectric-constant film forming section 5 using the transfer system 9. A silicon nitride film 14 is then formed as the high-dielectric-constant film on the silicon oxynitride film 13 by the CVD process, as shown in FIG. 2C. The thickness of the silicon nitride film 14 is set to 0.2 nm or around, for example.

The Si substrate 11 is then transferred to the post-annealing section 6 using the transfer system 9, and subjected to post-annealing in the post-annealing section 6. The Si substrate 11 is then transferred to the cooling section 7 using the transfer system 9, and cooled in the cooling section 7. The Si substrate 11 is then transferred to the unloading port 8 using the transfer system 9, and is unloaded out therethrough.

The atmosphere in the transfer system 9 herein is kept as a non-oxidative one, such as a nitrogen atmosphere, over a period from loading of the Si substrate 11 through the loading port 1 up to unloading through the unloading port 8.

Figure 2D:
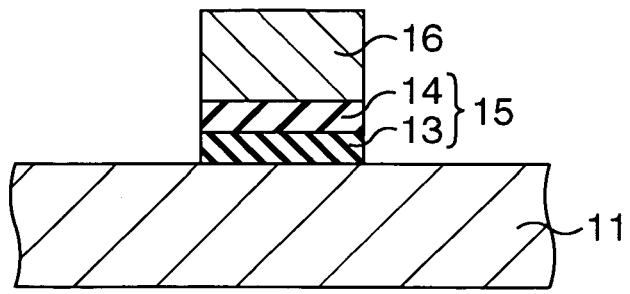

After the Si substrate 11 is unloaded through the unloading port 8, a gate electrode 16 is formed on a gate insulating film 15 composed of the silicon oxynitride film 13 and the silicon nitride film 14, as shown in FIG. 2D.

Figure 2E:
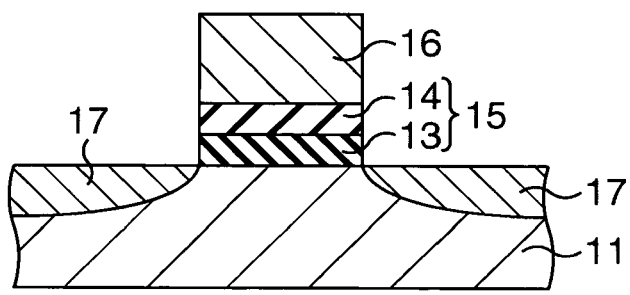

Impurity ion is then implanted using the gate electrode 16 as a mask, to thereby form low concentration impurity diffused layers (extension regions) 17 in the surficial portion of the Si substrate 11, as shown in FIG. 2E.

Figure 2F:
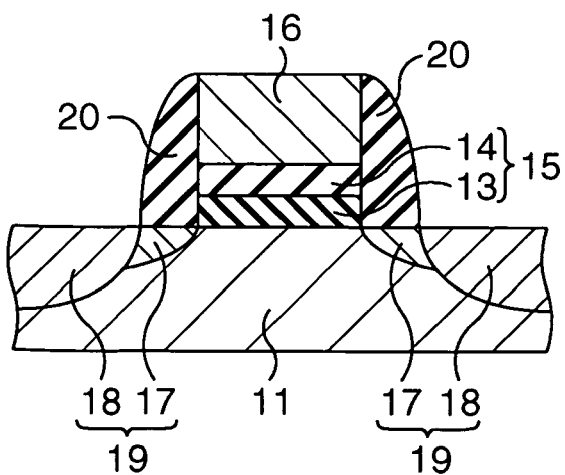

Next, as shown in FIG. 2F, a sidewall insulating film 20 are formed on the side face of the gate electrode 16, and an impurity ion is implanted using the gate electrode 16 and the sidewall insulating film 20 as a mask, to thereby form high concentration impurity diffused layers 18 in the surficial portion of the Si substrate 11. Source-and-drain regions 19 are composed of the low concentration impurity diffused layers 17 and the high concentration impurity diffused layers 18. A MOS transistor is thus formed.

Interlayer insulating films and wirings are thereafter formed, so that the semiconductor device is completed.

According to such first method of fabrication, in which the Si substrate 11 is subjected to plasma nitriding after being thoroughly cooled, it is made possible to appropriately control the reaction between the silicon oxide film 12 and active nitrogen to thereby obtain the silicon oxynitride film 13 having desired characteristics and thickness. More specifically, it is made possible to suppress nitrogen diffusion towards the Si substrate 11 side, and to obtain the silicon oxynitride film 13 having a larger amount of nitrogen distributed therein on the top surface side thereof. Such effect becomes more distinctive in particular for the gate insulating film having a thickness as small as 1.5 nm or below.

The Si substrate 11 is kept in a non-oxidative atmosphere isolated from the air over a period from completion of formation of the silicon oxide film 12 up to completion of the post-annealing, so that it is made possible to suppress growth of the native oxide film, and to prevent oxidation of the silicon oxynitride film 13 and the silicon nitride film 14. Growth of the native oxide film and oxidation of the silicon oxynitride film 13 and the silicon nitride film 14 even in the extra-thin surficial portion may vary the thickness of the gate insulating film 15, and to largely vary the characteristics such as gate leakage current. The first method of fabrication can preliminarily prevent such non-conformities.

(Second Method of Fabrication)

Paragraphs below will explain a second method of fabrication. FIGS. 3A to 3E are sectional views sequentially showing process steps of the second method of fabricating a semiconductor device.

Figure 3A:
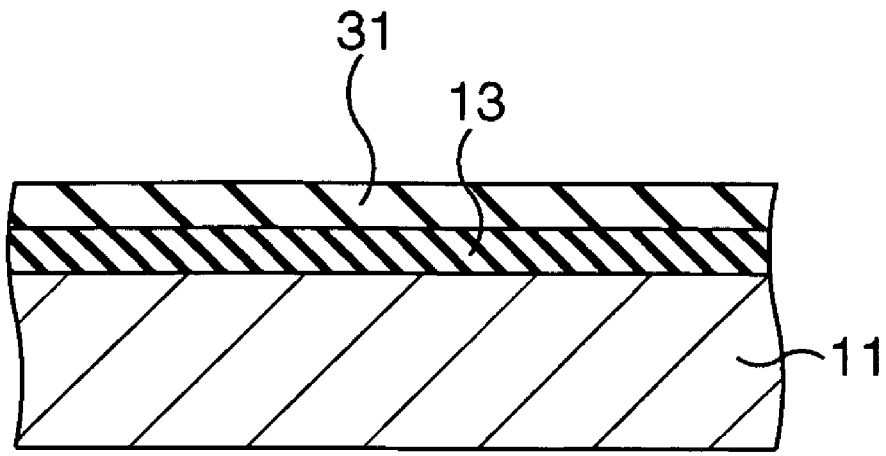
FIGS. 3A to 3E are sectional views sequentially showing a second method of fabricating a semiconductor device.

In the second method of fabrication, the process steps up to the formation of the silicon oxynitride film 13 are carried out similarly to as in the first method of fabrication. Next in the high-dielectric-constant film forming section 5, a hafnium oxide film ($HfO_2$ film) 31 is formed as the high-dielectric-constant film on the silicon oxynitride film 13, as shown in FIG. 3A. The hafnium oxide film 31 is, for example, formed by an ALD (atomic layered deposition) process. The thickness thereof is set to 3 nm or around, for example.

Figure 3B:
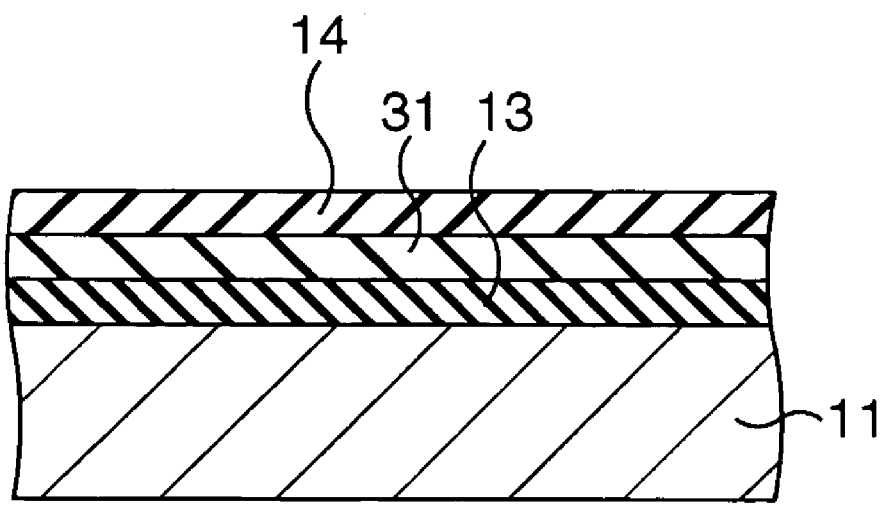

Next, in the same high-dielectric-constant film forming section 5, the silicon nitride film 14 is formed as the high-dielectric-constant film on the hafnium oxide film 31 as shown in FIG. 3B. The thickness of the silicon nitride film 14 is, for example, set to 0.2 nm or around.

The processes thereafter up to the unloading of the Si substrate 11 through the unloading port 8 are carried out similarly to those in the first method of fabrication.

Figure 3C:
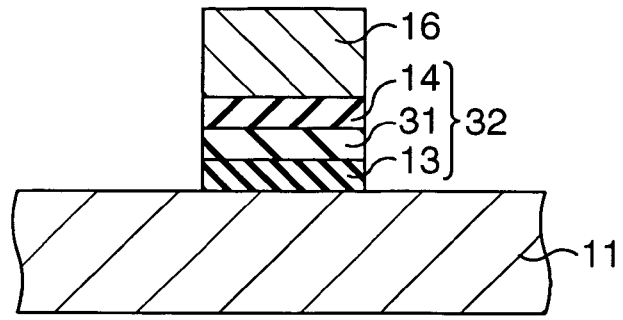

Next, a gate electrode 16 is formed on a gate insulating film 32 composed of the silicon oxynitride film 13, the hafnium oxide film 31 and the silicon nitride film 14, as shown in FIG. 3C.

Figure 3D:
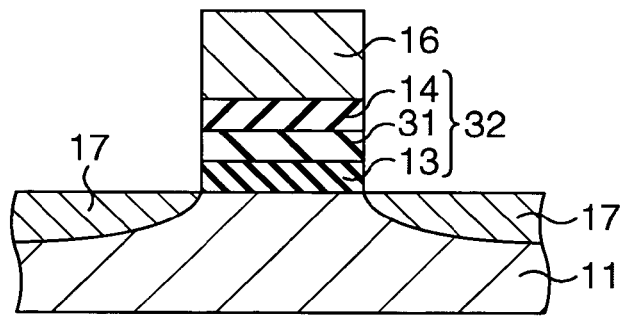

Next, an impurity ion is implanted using the gate electrode 16 as a mask, to thereby form the low concentration impurity diffused layers (extension regions) 17 in the surficial portion of the Si substrate 11, as shown in FIG. 3D.

Figure 3E:
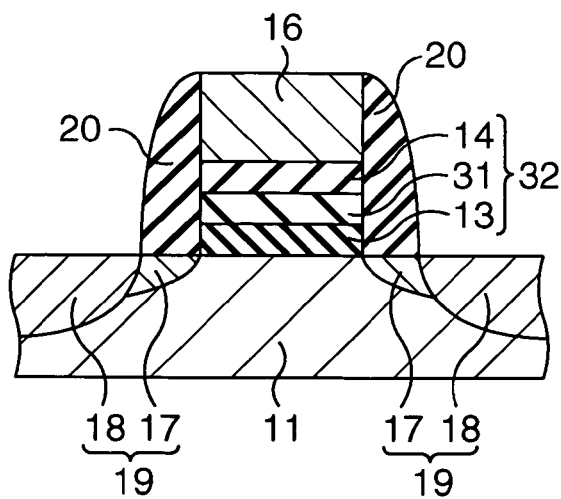

Next, as shown in FIG. 3E, the sidewall insulating film 20 is formed on the side face of the gate electrode 16, and an impurity ion is implanted using the gate electrode 16 and the sidewall insulating film 20 as a mask, to thereby form high concentration impurity diffused layers 18 in the surficial portion of the Si substrate 11. The source-and-drain regions 19 are composed of the low concentration impurity diffused layers 17 and the high concentration impurity diffused layers 18. A MOS transistor is thus formed.

Interlayer insulating films and wirings are thereafter formed, so that the semiconductor device is completed.

Also the second method of fabrication as described in the above is successful in providing the effects similar to those in the first method of fabrication.

It is to be noted that the formation of the high-dielectric-constant film(s), which was carried out in the high-dielectric-constant film forming section 5 in the first and second methods of fabrication, is omissible, and that the gate insulating film may be composed solely of the silicon oxynitride film 13. In other words, it is allowable to omit the high-dielectric-constant film forming section 5 itself from the apparatus shown in FIG. 1.

(Third Method of Fabrication)

Paragraphs below will describe a third method of fabrication. FIGS. 4A to 4F are sectional views sequentially showing process steps of the third method of fabrication.

Figure 4A:
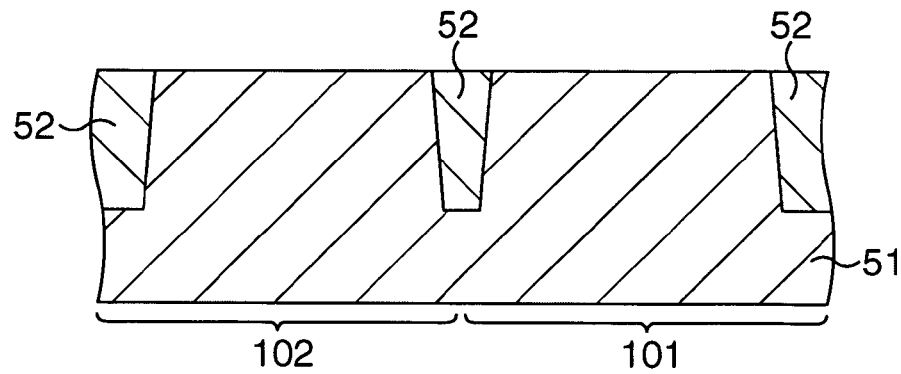
FIGS. 4A to 4F are sectional views sequentially showing a third method of fabricating a semiconductor device.

The third method of fabrication begins with wet cleaning of a Si substrate 51, which is followed by formation of element isolation insulating films 52 by an STI (shallow trench isolation) process, as shown in FIG. 4A. A plurality of element active regions are thus partitioned. In this process, at least one of the plurality of element active regions is formed in a thick film region 101, and at least other one is formed in a thin film region 102.

Figure 4B:
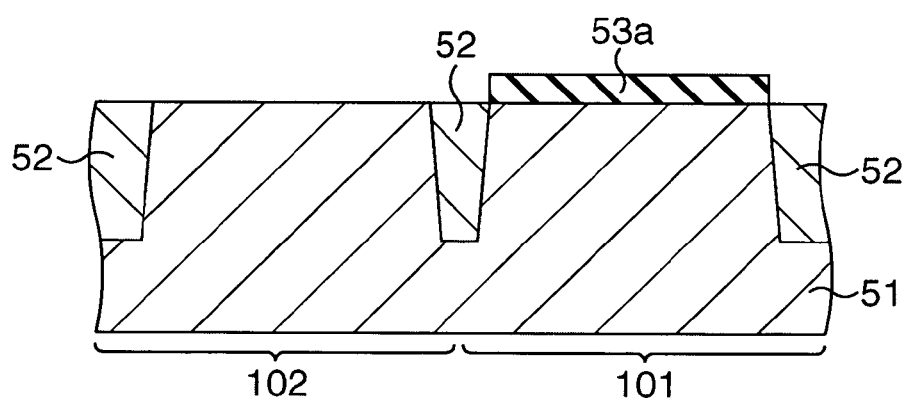
Figure 4C:
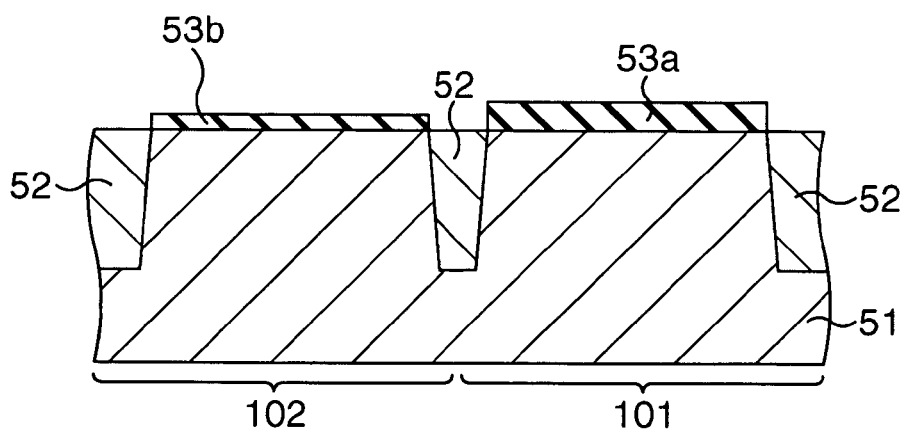

Next, a silicon oxide film 53a is formed in the thick film region 101 on the Si substrate 51 by pyrogenic oxidation at 800° C., as shown in FIG. 4B. Next, a silicon oxide film 53b of 1 nm thick, for example, is then formed in the thin film region 102 by thermal oxidation at 900° C., as shown in FIG. 4C. The silicon oxide film 53a is thickened during the formation of the silicon oxide film 53b. The thickness of the silicon oxide film 53a after formation of the silicon oxide film 53b is adjusted to 7 nm, for example. The silicon oxide films 53a and 53b are formed using the apparatus shown in FIG. 1. More specifically, the Si substrate 51 is loaded through the loading port 1 into the transfer system 9, and the silicon oxide films 53a and 53b are formed as underlying film on the surface of the Si substrate 51 in the underlying film forming section 2.

The Si substrate 51 is then transferred using the transfer system 9 to the cooling section 3. The Si substrate 51, the silicon oxide film 53a and the silicon oxide film 53b are then cooled in the cooling section 3 to as low as 100° C. or below, for example, and more preferably to as low as room temperature or below.

Figure 4D:
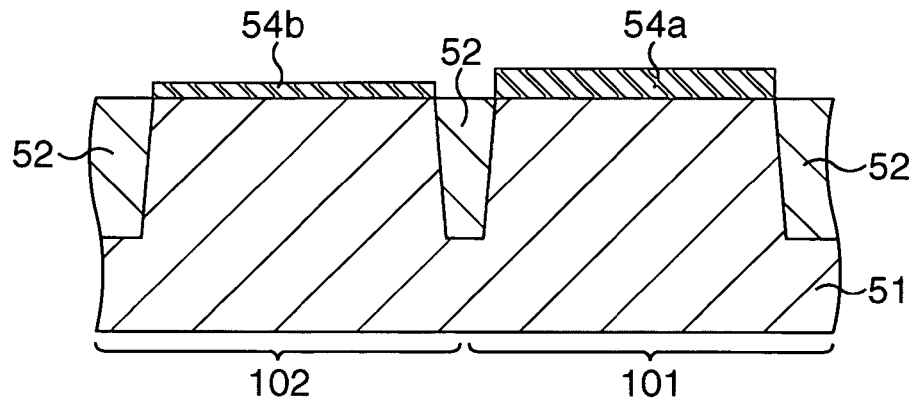

Thereafter, the Si substrate 51 is transferred using the transfer system 9 to the plasma nitriding section 4. The silicon oxide film 53a and the 53b are then subjected to plasma nitriding, to thereby convert the silicon oxide films 53a and 53b into silicon oxynitride films 54a and 54b, respectively, as shown in FIG. 4D. In the plasma nitriding, a nitrogen plasma is excited under an RF power of 500 W, for example, and active nitrogen is introduced to the silicon oxide films 53a and 53b, under conditions of 2.66 Pa (20 mTorr) at room temperature.

Thereafter, the Si substrate 51 is transferred to the post-annealing section 6 using the transfer system 9, and post-annealed in the post-annealing section 6. In the post-annealing, oxidative annealing (RTO) under a reduced-pressure oxygen atmosphere at around 1000° C., and annealing (RTA) under a nitrogen atmosphere at around 1050° C. are successively carried out, for example. The Si substrate 51 is then transferred to the cooling section 7 using the transfer system 9, and the Si substrate 41 is cooled in the cooling section 7. The Si substrate is then transferred to the unloading port 8 using the transfer system 9, and unloaded therethrough. The post-annealing may also be effected by a treatment in an oxynitriding atmosphere. An example of such annealing is such as oxynitriding annealing under a reduced-pressure NO gas at 900° C. to 1050° C., which is followed by annealing under a nitrogen atmosphere at 1050° C.

The atmosphere of the transfer system 9 herein, over a period from loading of the Si substrate 51 through the loading port 1 up to unloading through the unloading port 8, is conditioned as a non-oxidative atmosphere such as a nitrogen atmosphere.

Figure 4E:
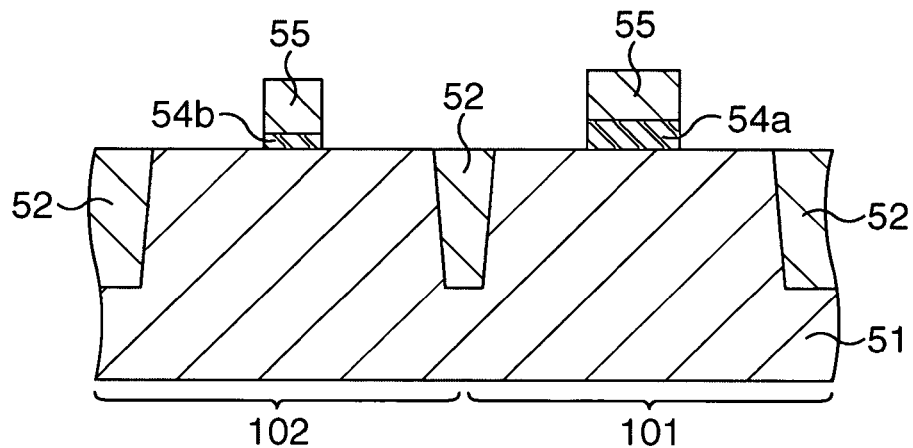

After the Si substrate 11 is unloaded through the unloading port 8, gate electrodes 55 are formed on the gate insulating films composed of the silicon oxynitride film 54*a* or 54*b*, as shown in FIG. 4E.

Figure 4F:
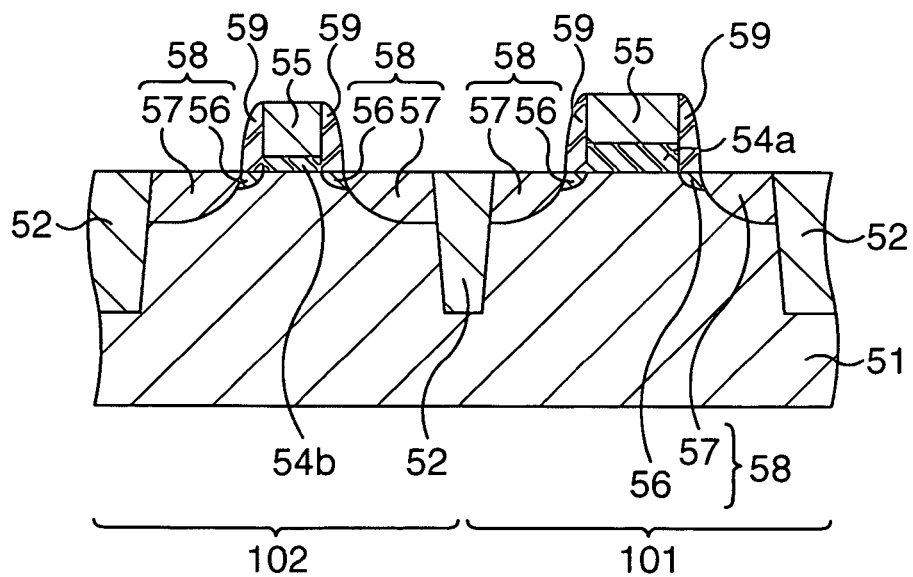

Next, low concentration impurity diffused layers (extension regions) 56, sidewall insulating films 59 and high concentration impurity diffused layers 57 are formed similarly to as described in the first and the second embodiments, as shown in FIG. 4F. The source-and-drain regions 58 are composed of the low concentration impurity diffused layers 56 and the high concentration impurity diffused layers 57. MOS transistors are thus completed.

Interlayer insulating films and wirings are thereafter formed to thereby complete the semiconductor device.

Also the third method of fabrication as described in the above is successful in providing the effects similar to those in the first and the second methods of fabrication.

The MOS transistor formed in the thick film region 101 is used, for example, for a circuit which needs high withstand voltage, and the MOS transistor formed in the thin film region 102 is used, for example, for a circuit which needs high speed operation. The thicknesses of the gate insulating films may vary in three ways or more. For example, the thickness of a gate insulating film in the thin film region 102 may vary in two ways. In this case, the thickness of a gate insulating film of a MOS transistor largely needing suppression of a leakage current is may be set to 1.0 nm, and the thickness of a gate insulating film of a MOS transistor allowing a certain level of the leakage current may be set to 1.5 nm.

In the third method of fabrication, the thick silicon oxide film 53*a* is formed in the thick film region 101, and the thin silicon oxide film 53*b* is formed in the thin film region 102, whereas it is also allowable to form gate insulating films which differ from each other in the thickness, within a single element active region partitioned by the element isolation insulating film.

(Test Case)

Results of a test conducted by the present inventor will be explained below. In the test, a gate insulating film was formed using the apparatus shown in FIG. 1, and relations among the cooling time in the cooling section 3, nitrogen content of the gate insulating film and the thickness of the film were investigated. Results are shown in FIG. 5.

A silicon oxide film of 1.0 nm thick was formed as the underlying film, by lamp heating (thermal oxidation) in an oxygen atmosphere in the underlying film forming section 2. Thereafter in the underlying film forming section 2, the semiconductor substrate was cooled to a temperature lower than 500° C. The semiconductor substrate was further cooled in the cooling section 3. A nitrogen plasma was then excited in the plasma nitriding section 4 under an RF power of 500 W, and active nitrogen was introduced to the silicon oxide film under conditions of 2.66 Pa (20 mTorr) at room temperature. Next, in the post-annealing section 6, oxidative annealing (RTO) under a reduced-pressure oxygen atmosphere at 1000° C., and annealing (RTA) under a nitrogen atmosphere at 1050° C. were successively carried out.

Figure 5:
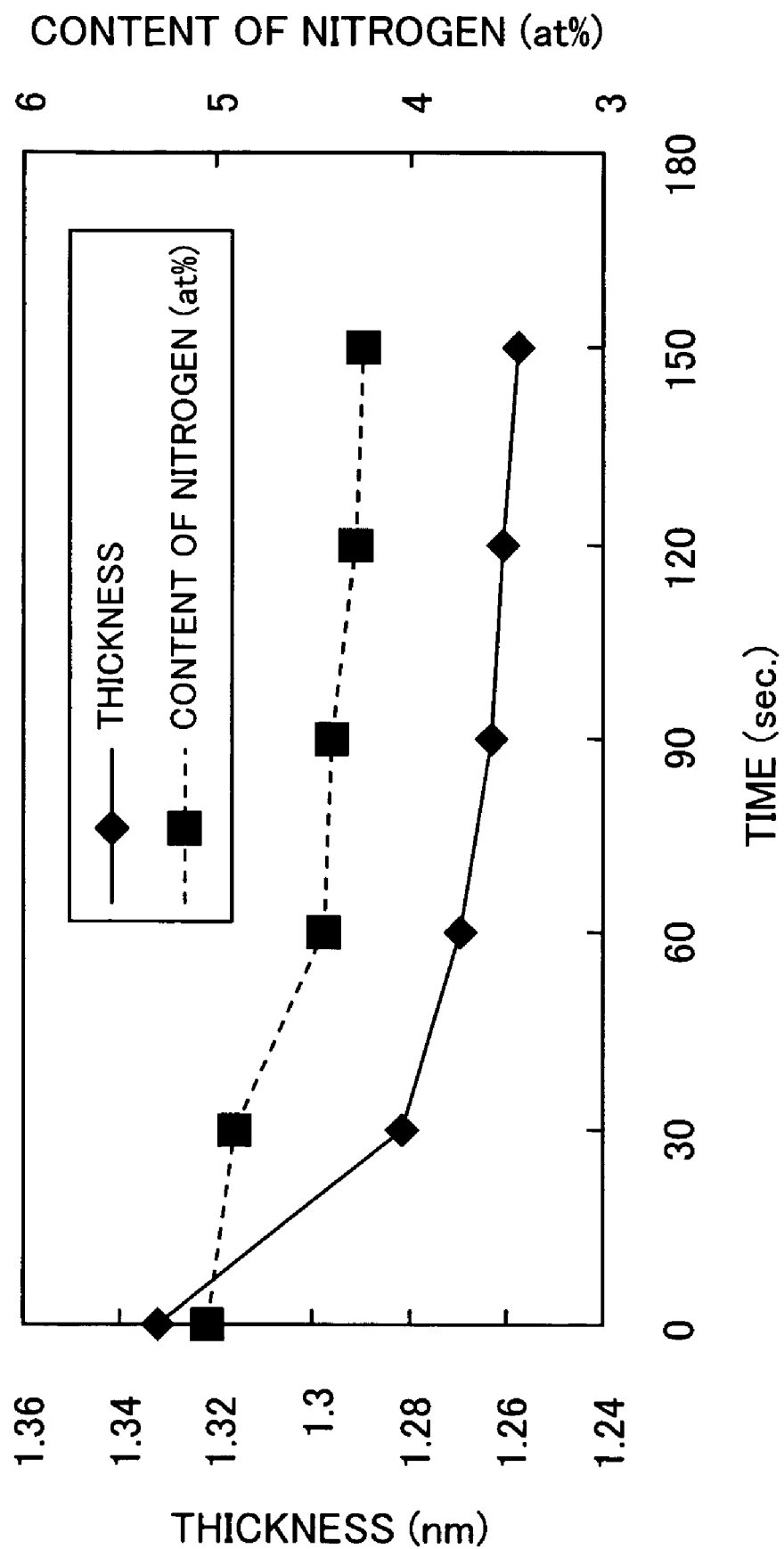
FIG. 5 is a graph showing relations of cooling time in a cooling section 3 with nitrogen content of a gate insulating film and thickness thereof.
Figure 7:
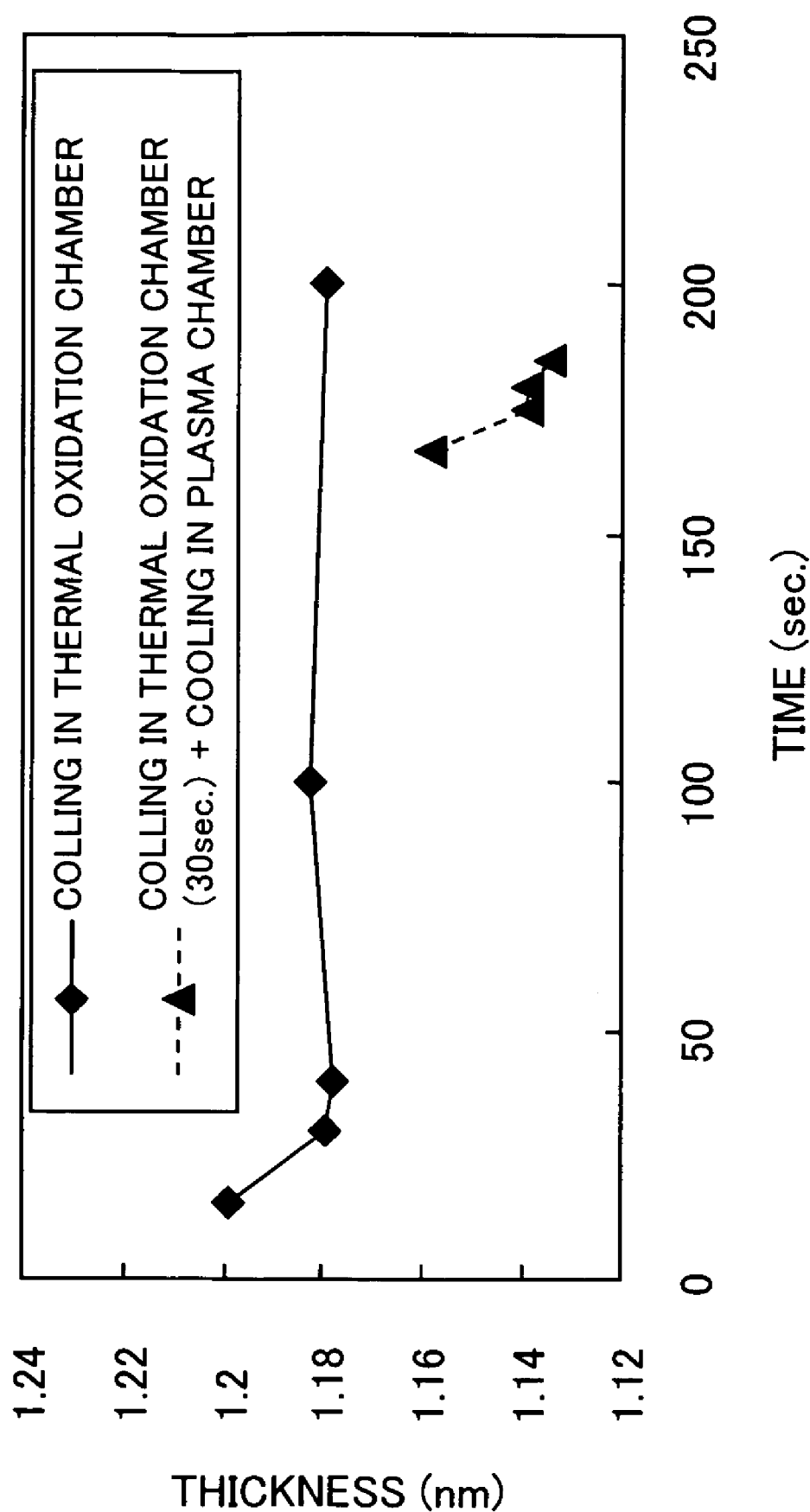
FIG. 7 is a graph showing relations between cooling time after thermal oxidation and thickness of gate insulating film.

It was found, as shown in FIG. 5, that variations in the thickness and the nitrogen content of the gate insulating film reduced after 60 seconds or longer cooling. Temperature of the semiconductor substrate at this time was approximately 100° C. from measurement using a radiant heat thermometer. It can be said from the measurement that nitriding of the underlying film after cooling the semiconductor substrate to as low as 100° C. or around makes it possible to obtain the gate insulating film having small variation in the characteristics. The time herein necessary for cooling to as low as 100° C. can be shortened by appropriately adjusting the kinds, flow rate and the like of the liquid coolant or the like.

In view of simply obtaining a gate insulating film having small variation in the characteristics, it is allowable to omit the cooling section 3, and to cool a semiconductor substrate in the underlying film forming section 2 or in the plasma nitriding section 4. Cooling in the cooling section 3, however, makes it possible to largely improve the process efficiency. The effects expectable herein will be explained.

FIG. 6 is a drawing showing relations of presence or absence of the cooling section 3 with the number of processed substrates. Assumptions were made herein that each of formation of the underlying film, plasma nitriding and post-annealing takes 2 minutes, and cooling takes 1 minute, that the high-dielectric-constant film is not formed, and that the time necessary for transfer is included in the above-described 2 minutes or in 1 minute.

For a case where the cooling takes place in the cooling section 3, the cooling starts in the cooling section 3 every time formation of the underlying film comes to the end, as shown in the top table in FIG. 6. Every time the cooling completes, plasma nitriding starts in the plasma nitriding section 4, and every time the plasma nitriding completes, post-annealing starts in the post-annealing section 6. As a consequence, it takes 55 minutes to finish post-annealing of 25 substrates, while FIG. 6 shows only an elapse of time of as long as 15 minutes. In other words, the possibly largest number of semiconductor substrates processed within one hour is 27.5.

On the other hand, for another case where the cooling takes place in the underlying film forming section 2, as shown in the middle table of FIG. 6, the process in the underlying film forming section 2 takes 3 minutes, whereas the process in the plasma nitriding section 4 takes 2 minutes. This inevitably produces one-minute idle time between completion of the previous process and start of the next process. As a consequence, it takes 79 minutes to finish post-annealing of 25 substrates, while FIG. 6 shows only an elapse of time of as long as 15 minutes. In other words, the possibly largest number of semiconductor substrates processed within one hour is 18.3.

For still another case where the cooling takes place in the plasma nitriding section 4, as shown in the bottom table of FIG. 6, the process in the plasma nitriding section 4 takes 3 minutes, whereas the process in the post-annealing section 6 takes 2 minutes. This inevitably produces one-minute idle time in the post-annealing section 6. As a consequence, it takes 79 minutes to finish post-annealing of 25 substrates, while FIG. 6 shows only an elapse of time of as long as 15 minutes. In other words, the possibly largest number of semiconductor substrates processed within one hour is 18.3.

As is clear from the above, provision of the cooling section 3 can raise the throughput approximately 1.5 times as large as the case where the cooling takes place in the underlying film forming section 2 or in the plasma nitriding section 4. A high throughput is thus expectable by providing the cooling section 3.

Patent Document 2 discloses a substrate processing apparatus having a cooling chamber cooling a semiconductor substrate after a high-dielectric-constant film is formed. The cooling chamber, however, corresponds merely to the cooling section 7 shown in FIG. 1, and there is no description on nitriding an insulating film after the cooling.

According to the present invention, the temperature of the semiconductor substrate is kept at 100° C. or below when active nitrogen is introduced into the insulating film, so that it is made possible to suppress variation in characteristics of the gate insulating film even if it is formed with only a small thickness.

What is claimed is:

1. A method of fabricating a semiconductor device comprising:
    forming a silicon oxide film on a semiconductor substrate by thermal oxidation in a first insulating film forming unit;
    after said forming a silicon oxide film, transferring said semiconductor substrate to a cooling unit using a transferring unit;
    decreasing a temperature of said semiconductor substrate from a temperature of the thermal oxidation to 100° C. or below in non-oxidative atmosphere in said cooling unit;
    after said decreasing a temperature, transferring said semiconductor substrate to a nitriding unit using said transferring unit; and
    introducing active nitrogen into said silicon oxide film while maintaining temperature of said semiconductor substrate at 100° C. or below in said nitriding unit.

2. The method of fabricating a semiconductor device according to claim 1, wherein at least said forming and said decreasing are successively carried out in a chamber isolated from the atmospheric air.

3. The method of fabricating a semiconductor device according to claim 1, wherein radical nitrogen or plasma-derived nitrogen species is used as said active nitrogen.

4. The method of fabricating a semiconductor device according to claim 1, wherein the thickness of said silicon oxide film is adjusted to 1.5 nm or smaller.

5. The method of fabricating a semiconductor device according to claim 1, further comprising:
    forming an insulating film, having a dielectric constant larger than that of said silicon oxide film, on said silicon oxide film in a second insulating film forming unit, after the introducing active nitrogen.

6. The method of fabricating a semiconductor device according to claim 5, where the thickness of said silicon oxide film and said insulating film is adjusted to 1.5 nm or smaller in total.

7. The method of fabricating a semiconductor device according to claim 1, further comprising:
    post-annealing said silicon oxide film in an annealing unit.

8. The method of fabricating a semiconductor device according to claim 1, further comprising:
    removing a native oxide film from said semiconductor substrate, before said forming the silicon oxide film in a removing unit.

9. The method of fabricating a semiconductor device according to claim 1, wherein the silicon oxide film includes two types of films differing from each other in the thickness.

10. The method of fabricating a semiconductor device according to claim 1, wherein said decreasing includes using a liquid coolant.

11. A method of fabricating a semiconductor device comprising:
    forming a silicon oxide film on a semiconductor substrate by thermal oxidation in a first insulating film forming unit;
    after the forming a silicon oxide film, transferring said semiconductor substrate to a cooling unit using a transferring unit;
    decreasing a temperature of said semiconductor substrate from a temperature of the thermal oxidation to 100° C. or below in non-oxidative atmosphere in said cooling unit;
    after the decreasing a temperature, transferring said semiconductor substrate to a nitriding unit using said transferring unit; and
    introducing active nitrogen into said silicon oxide film while maintaining temperature of said semiconductor substrate at 100° C. or below in said nitriding unit.

12. The method of fabricating a semiconductor device according to claim 11, wherein the thickness of said silicon oxide film is adjusted to 1.5 nm or smaller.

13. The method of fabricating a semiconductor device according to claim 1, wherein said non-oxidative atmosphere is nitrogen atmosphere or hydrogen atmosphere.

14. The method of fabricating a semiconductor device according to claim 11, wherein said non-oxidative atmosphere is nitrogen atmosphere or hydrogen atmosphere.

15. The method of fabricating a semiconductor device according to claim 1, wherein the thermal oxidation is performed at 900° C. or around.

16. A method of fabricating a semiconductor device comprising:
    forming a first silicon oxide film on a first semiconductor substrate by thermal oxidation;
    decreasing a temperature of said first semiconductor substrate from a temperature of the thermal oxidation to 100° C. or below in non-oxidative atmosphere;
    after the decreasing the temperature of said first semiconductor substrate, introducing active nitrogen into said first silicon oxide film while maintaining temperature of said first semiconductor substrate at 100° C. or below;
    forming a second silicon oxide film on a second semiconductor substrate by thermal oxidation;
    decreasing a temperature of said second semiconductor substrate from a temperature of the thermal oxidation to 100° C. or below in non-oxidative atmosphere;
    after the decreasing the temperature of said second semiconductor substrate, introducing active nitrogen into said second silicon oxide film while maintaining temperature of said second semiconductor substrate at 100° C. or below;

forming a third silicon oxide film on a third semiconductor substrate by thermal oxidation;

decreasing a temperature of said third semiconductor substrate from a temperature of the thermal oxidation to 100° C. or below in non-oxidative atmosphere; and after the decreasing the temperature of said third semiconductor substrate, introducing active nitrogen into said third silicon oxide film while maintaining temperature of said third semiconductor substrate at 100° C. or below, wherein said introducing active nitrogen into said first silicon oxide film, said decreasing a temperature of said second semiconductor substrate, and said forming a third silicon oxide film are carried out in parallel with one another.

\* \* \* \* \*